(12) United States Patent
Ichikawa et al.

(10) Patent No.: US 8,823,247 B2
(45) Date of Patent: Sep. 2, 2014

(54) PIEZOELECTRIC VIBRATING DEVICES INCLUDING RESPECTIVE PACKAGES IN WHICH CASTELLATIONS INCLUDE RESPECTIVE CONNECTING ELECTRODES

(75) Inventors: Ryoichi Ichikawa, Saitama (JP); Yoshiaki Amano, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 452 days.

(21) Appl. No.: 13/212,030

(22) Filed: Aug. 17, 2011

(65) Prior Publication Data

US 2012/0043860 A1 Feb. 23, 2012

(30) Foreign Application Priority Data

Aug. 20, 2010 (JP) .................................. 2010-184612

(51) Int. Cl.
H01L 41/08 (2006.01)
H03H 3/02 (2006.01)
H03H 9/10 (2006.01)

(52) U.S. Cl.
CPC .............. H03H 9/1014 (2013.01); H03H 3/02 (2013.01)
USPC .......................................... 310/344; 310/320

(58) Field of Classification Search
CPC .. H03H 9/0519; H03H 9/1021; H03H 9/1071
USPC .......................................... 310/344, 348, 321
See application file for complete search history.

(56) References Cited

U.S. PATENT DOCUMENTS

| 6,249,049 B1 * | 6/2001 | Kamada et al. ................ 257/703 |
| 6,396,201 B1 * | 5/2002 | Ide et al. ........................ 310/353 |
| 6,848,153 B2 * | 2/2005 | Tsuzuki et al. ............. 29/25.35 |

(Continued)

FOREIGN PATENT DOCUMENTS

| JP | H08-340184 | 12/1996 |
| JP | H09-148875 | 6/1997 |

(Continued)

OTHER PUBLICATIONS

Office Action for related Japanese Patent Application No. 2010-184612, 3 pages, dated Feb. 26, 2014.

*Primary Examiner* — J. San Martin
(74) *Attorney, Agent, or Firm* — Klarquist Sparkman, LLP

(57) ABSTRACT

Piezoelectric vibrating devices are disclosed that lack base through-holes and that can be manufactured on a wafer scale. Also disclosed are methods for making same. An exemplary piezoelectric device has a package base having first and second opposing main surfaces. On the second (outer) first main surface is formed a pair of external electrodes. The first (inner) main surface defines a first recess and a peripheral first bonding surface. A pair of connecting electrodes are provided for connecting to the respective external electrodes via respective edge surfaces of the package base that extend between the first and second main surfaces. A piezoelectric vibrating piece is mounted in and contained within the package base. The vibrating piece includes a pair of excitation electrodes electrically connected to respective connecting electrodes. A package lid comprises first and second main surfaces, of which the second (inner) main surface defines a second recess that is larger than the first recess. The second main surface also defines a second bonding surface that peripherally surrounds the second recess. A sealing material is applied, over the width of the second bonding surface, circumferentially between the first bonding surface and the second bonding surface.

1 Claim, 14 Drawing Sheets

(56) References Cited

U.S. PATENT DOCUMENTS

| | | | |
|---|---|---|---|
| 7,514,852 B2* | 4/2009 | Kasahara et al. | 310/343 |
| 8,232,845 B2* | 7/2012 | Ruby et al. | 331/68 |
| 8,319,404 B2* | 11/2012 | Takahashi | 310/348 |
| 8,659,213 B2* | 2/2014 | Mizusawa et al. | 310/348 |
| 2006/0255691 A1* | 11/2006 | Kuroda et al. | 310/348 |
| 2008/0271908 A1* | 11/2008 | Yamamoto et al. | 174/50.5 |
| 2012/0068579 A1* | 3/2012 | Ichikawa et al. | 310/367 |
| 2012/0074816 A1* | 3/2012 | Mizusawa | 310/344 |
| 2012/0212105 A1* | 8/2012 | Sekiguchi | 310/344 |
| 2013/0241362 A1* | 9/2013 | Ichikawa | 310/367 |

FOREIGN PATENT DOCUMENTS

| | | |
|---|---|---|
| JP | H09-181557 | 7/1997 |
| JP | 2003-264444 | 9/2003 |
| JP | 2005-057520 | 3/2005 |
| JP | 2005-333037 | 12/2005 |
| JP | 2008-066885 | 3/2008 |

* cited by examiner

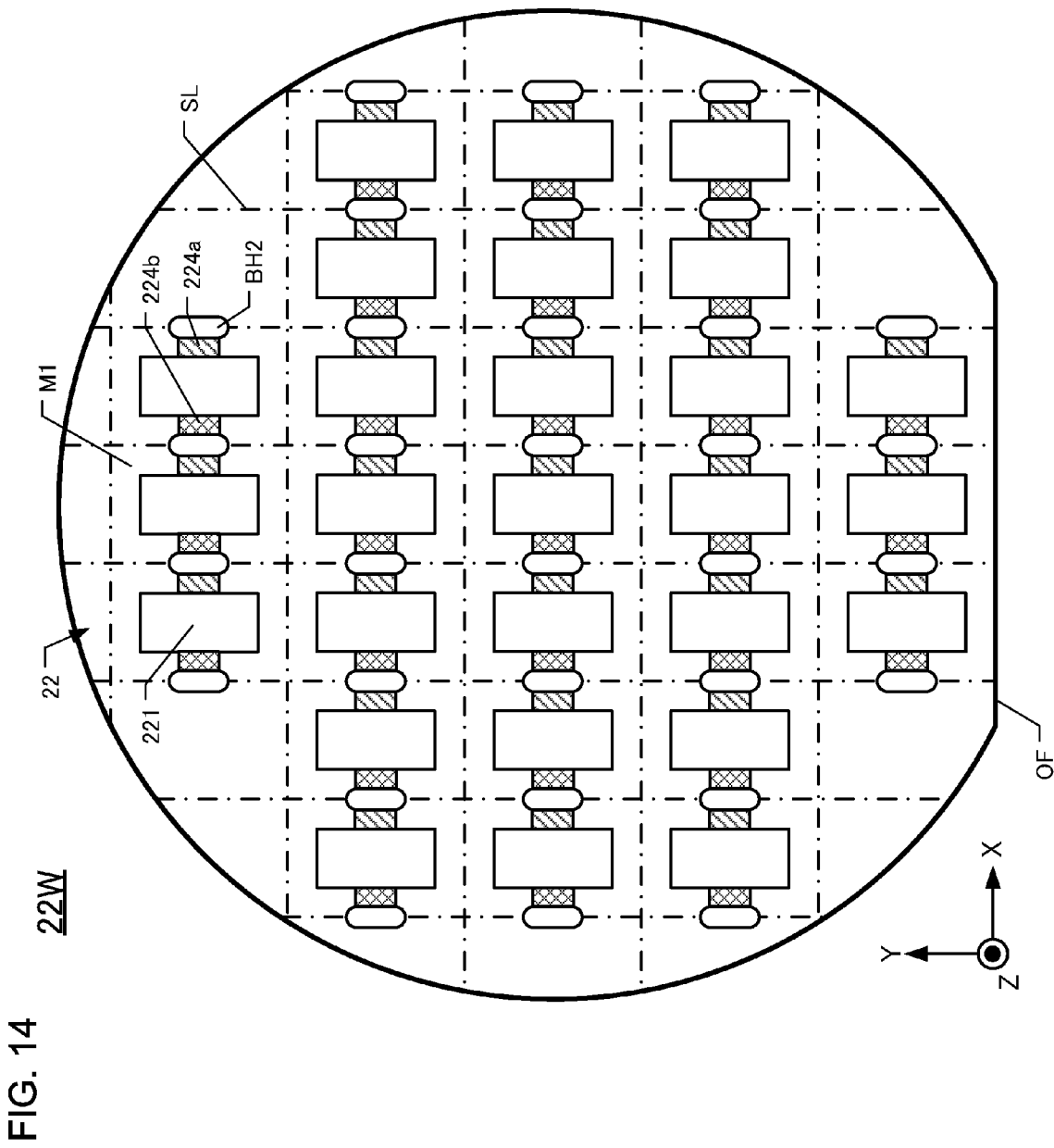

PIEZOELECTRIC VIBRATING DEVICES INCLUDING RESPECTIVE PACKAGES IN WHICH CASTELLATIONS INCLUDE RESPECTIVE CONNECTING ELECTRODES

CROSS-REFERENCE TO RELATED APPLICATION

This application claims priority to and the benefit of Japan Patent Application No. 2010-184612, filed on Aug. 20, 2010, in the Japan Patent Office, the disclosure of which is incorporated herein by reference in its entirety.

FIELD

This disclosure pertains to, inter alia, methods for manufacturing piezoelectric devices, in which methods the piezoelectric vibrating piece is mounted onto a package manufactured as a lid wafer or base wafer. The disclosure also pertains to piezoelectric vibrating devices produced by such methods.

DESCRIPTION OF THE RELATED ART

As shown in Japan Unexamined Patent Publication No. 2005-333037, a surface-mountable type of piezoelectric device comprises a ceramic base having an insulating property. The base is fabricated of an alumina ceramic. A lid, fabricated of glass or of a kovar alloy, is affixed to the open portion of the ceramic base. The ceramic base and lid thus form a cavity that contains the piezoelectric vibrating piece sealed in the cavity.

In Japan Unexamined Patent Publication No. 2005-057520, the base can be fabricated of glass instead of a ceramic, so as to achieve cost reduction. The glass base and lid are bonded together using a low-melting-point glass.

Piezoelectric devices as disclosed in the JP '037 reference comprise a base made of a ceramic. Consequently, manufacturing these devices requires performing a manufacturing step on each ceramic piece, which is disadvantageous from the perspective of cost reduction. In the JP '520 reference, as noted, the piezoelectric device comprises a base made of glass; again, the manufacturing method for producing these devices requires performing a manufacturing step on each piece, which is disadvantageous for mass production. Also, the piezoelectric devices disclosed in JP '520 require forming a through-hole on each glass base and forming a connecting electrode having a thickness of at least 30 μm on the main surface of the glass base to prevent the piezoelectric vibrating piece and the glass base from contacting each other. Consequently, the piezoelectric devices disclosed in the JP '520 have higher manufacturing costs despite the fact that the base is fabricated of inexpensive glass.

The present disclosure provides, inter alia, piezoelectric devices that do not require through-holes in their bases and that can be manufactured at a wafer scale (in which hundreds to thousands of bases can be manufactured simultaneously. The present disclosure also provides methods for manufacturing piezoelectric device, in which connecting electrode can be fabricated having a thickness (several hundred nm), formed by sputtering or vacuum-deposition.

SUMMARY

A first aspect of the invention pertains to piezoelectric devices, of which a representative embodiment comprises a package base, a piezoelectric vibrating piece, and a package lid. The package base has a rectangular profile and includes an outer main surface including a pair of external electrodes and an inner main surface situated opposite the outer main surface. The inner main surface defines a first recess and a first bonding surface peripherally surrounding the first recess, and includes respective connecting electrodes electrically connected to the external electrodes. The piezoelectric vibrating piece is mounted to the inner main surface of the package base and includes respective excitation electrodes electrically connected to the connecting electrodes. The package lid defines a second recess and a second bonding surface. The second bonding surface has a width and peripherally surrounds the second recess. The second recess is larger than the first recess. The package lid covers the piezoelectric vibrating piece mounted to the package base. A sealing material, having a width substantial equal to the width of the second bonding surface, is disposed circumferentially between the first bonding surface and the second bonding surface, thereby sealing the package lid to the package base.

The package base desirably has a rectangular plan profile, when viewed from above, that includes first and second opposing edges. Each edge has a length and defines a respective castellation having a length greater than half the length of the respective side. In certain embodiments each connecting electrode is situated in a respective one of said castellations, in which each connecting electrode has greater length than half the length of the respective castellation.

According to another aspect, methods are provided for manufacturing a piezoelectric device. An embodiment of such a method comprises preparing a base wafer comprising multiple package bases each having a rectangular profile. Each package base comprises an outer main surface and an inner main surface situated opposite the outer main surface. On each package base, a pair of external electrodes is formed on the outer main surface and a first recess is formed on the inner main surface, wherein the first recess is surrounded by a peripheral first bonding surface of the inner main surface, and the peripheral first bonding surface has a respective width. On the base wafer, a pair of through-holes is formed between each pair of adjacent package bases on the base wafer. Each through-hole has a rectangular profile and extends from the inner main surface to the outer main surface. On the base wafer, respective connecting electrodes are formed and electrically connected to the external electrodes through the respective through-holes. With respect to each package base on the base wafer, a piezoelectric vibrating piece is mounted that has a pair of excitation electrodes. The piezoelectric vibrating pieces are mounted to the package base such that the excitation electrodes are electrically connected to the respective connecting electrodes on the package base. A lid wafer is prepared that comprises multiple package lids each having an inner main surface defining a second recess and an outer main surface situated opposite the inner main surface. The second recess is surrounded by a peripheral second bonding surface of the inner main surface. The second bonding surface has a respective width, and the second recess is larger than the first recess. The lid wafer and base wafer are aligned such that each first bonding surface is registered with each respective second bonding surface. A sealing material is applied on the respective first or second peripheral bonding surfaces of the base wafer or the lid wafer, wherein the sealing material is applied circumferentially at a width that is substantial equal to the width of the second bonding surface. The base wafer and lid wafer are heated and compressed together to bring respective registered first and second bonding surfaces together and to cause the sealing material to form a sealed bond between each respective first and second bonding surfaces, thereby forming a wafer sandwich containing multiple piezoelectric vibrating devices.

In some embodiments the step of mounting the piezoelectric vibrating pieces comprises mounting the piezoelectric vibrating piece to the respective connecting electrodes using an electrically conductive adhesive.

After heating and compressing the wafers together, the method desirably comprises the step of cutting the wafer sandwich along pre-established scribe lines after the heating and compression step, wherein the scribe lines extend through co-registered through-holes of adjacent piezoelectric vibrating devices on the wafer sandwich.

The sealing material desirably is an adhesive made of glass that melts at temperature between 350° C. and 410° C.

Before bonding the wafers together, the method can include the steps of contacting a respective probe of a frequency-measurement device to each connecting electrode or external electrode of a piezoelectric vibrating device and measuring a vibration frequency of each piezoelectric vibrating piece.

In some embodiments each piezoelectric vibrating piece has respective sides on which the through-holes were formed, wherein each through-hole is formed as a respective elongated circle having length of ⅓ to ½ of the respective side.

In some embodiments each connecting electrode has a width of at least half the length of the respective through-hole.

As summarized above, the various aspects provide, inter alia, piezoelectric devices that can be manufactured at a wafer level, which allows reduction of manufacturing cost. Also, the absence of toxic gas or water vapor inside the piezoelectric device allows mass-production of the piezoelectric device. Further, due to the absence of toxic gas or water vapor, the piezoelectric vibrating piece vibrates or oscillates with high stability.

BRIEF DESCRIPTION OF THE DRAWINGS

FIG. 2 also shows the quartz-crystal vibrating piece 10 in a condition suitable for measuring its vibration frequency.

FIG. 11 also shows the vibration frequency of the piezoelectric vibrating piece being measured.

FIG. 14 is a plan view of the base wafer on which multiple package bases can be manufactured simultaneously.

DETAILED DESCRIPTION

First Embodiment of Quartz-Crystal Vibrating Piece

Figure 1:
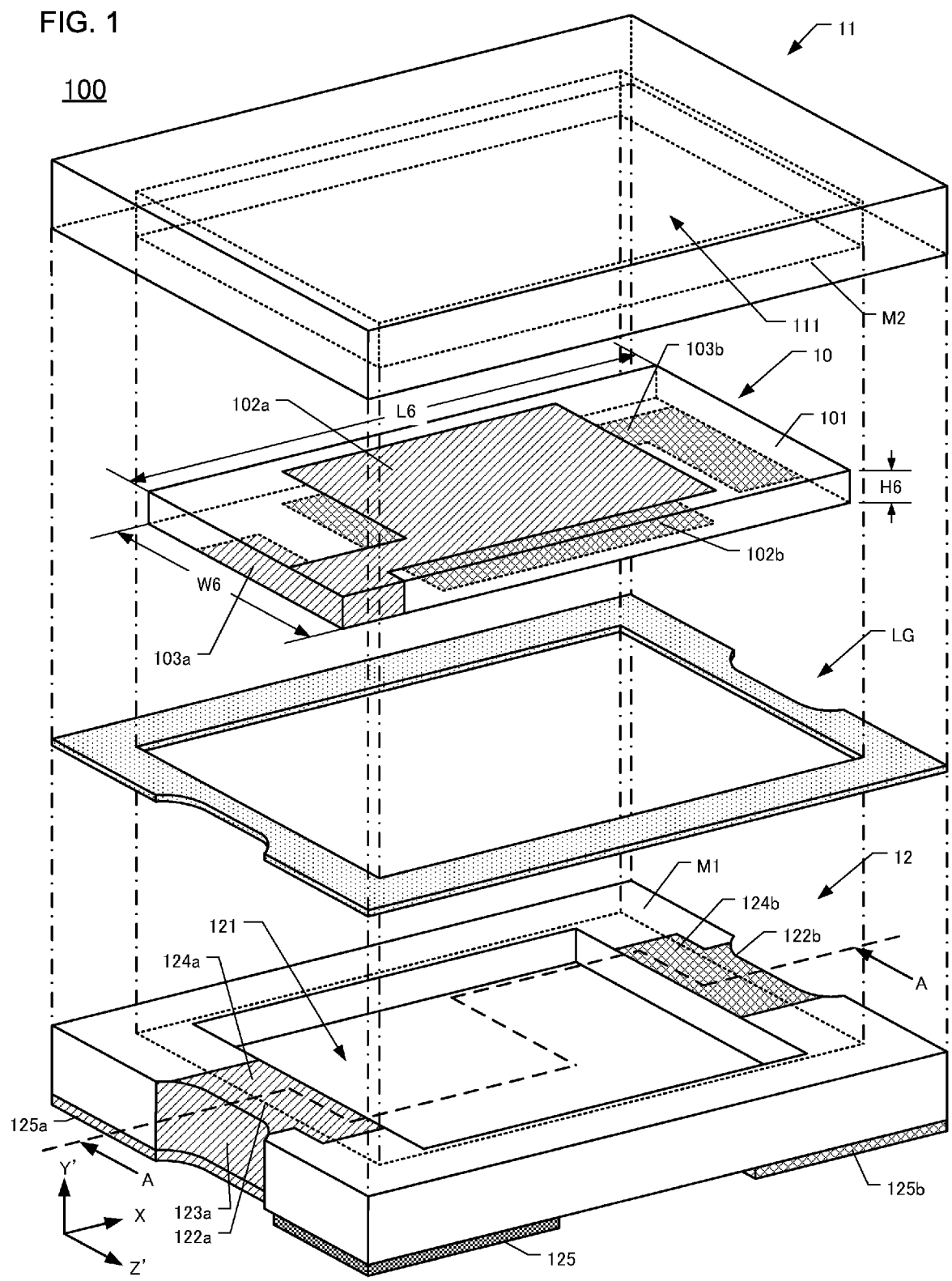
FIG. 1 is an exploded perspective view of a first embodiment of a quartz-crystal vibrating device.
Figure 2:
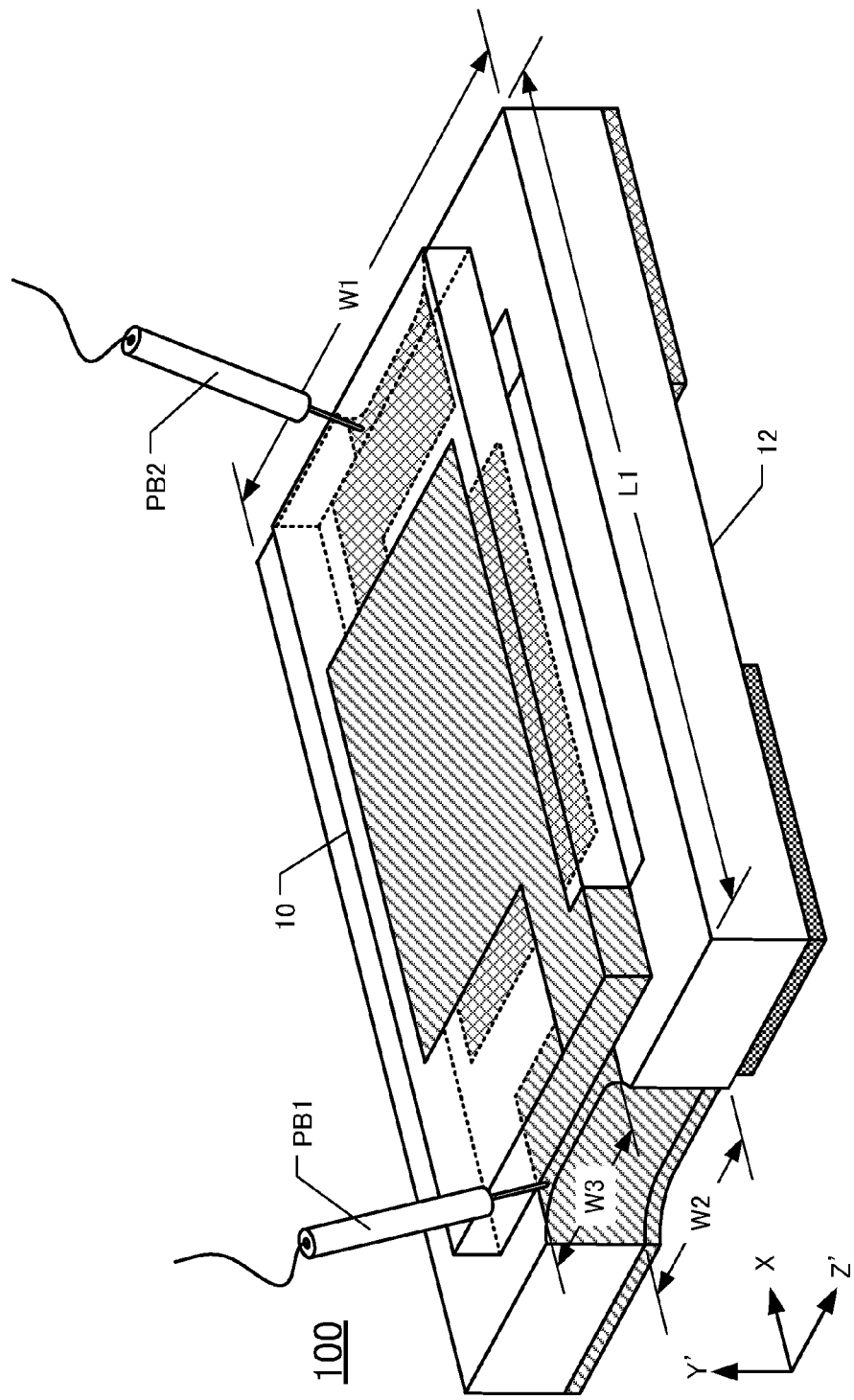
FIG. 2 is a perspective view of the first embodiment of a quartz-crystal vibrating piece after mounting a quartz-crystal vibrating piece 10 onto the package base 12 and before bonding a package lid 11 to the package base 12.
Figure 3A:
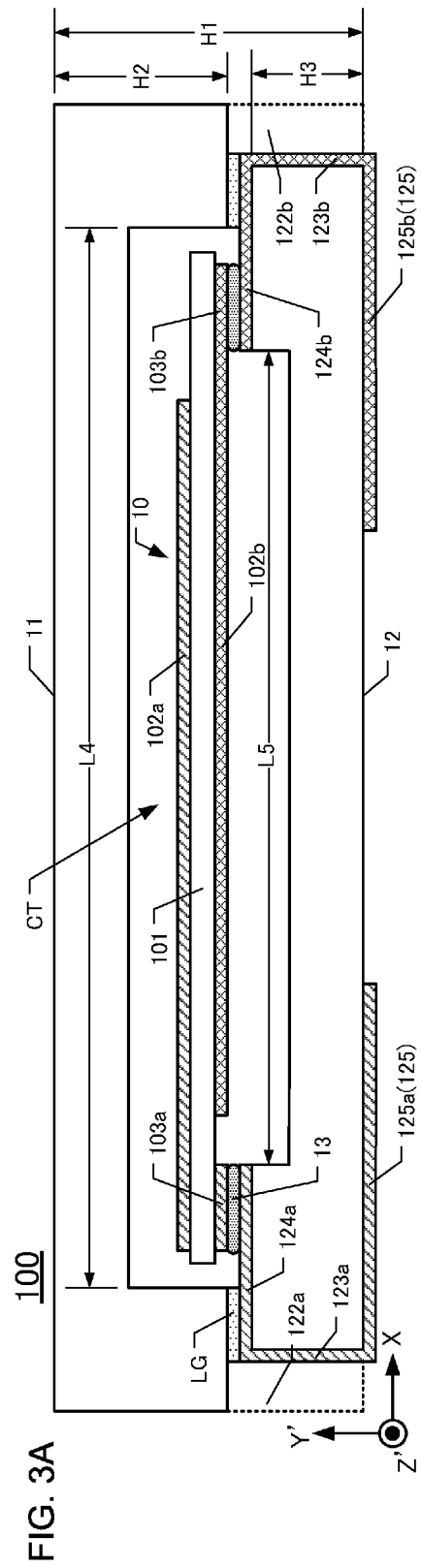
FIG. 3A is a cross-sectional view of the device shown in FIG. 1, along the line A-A in FIG. 1.
Figure 3B:
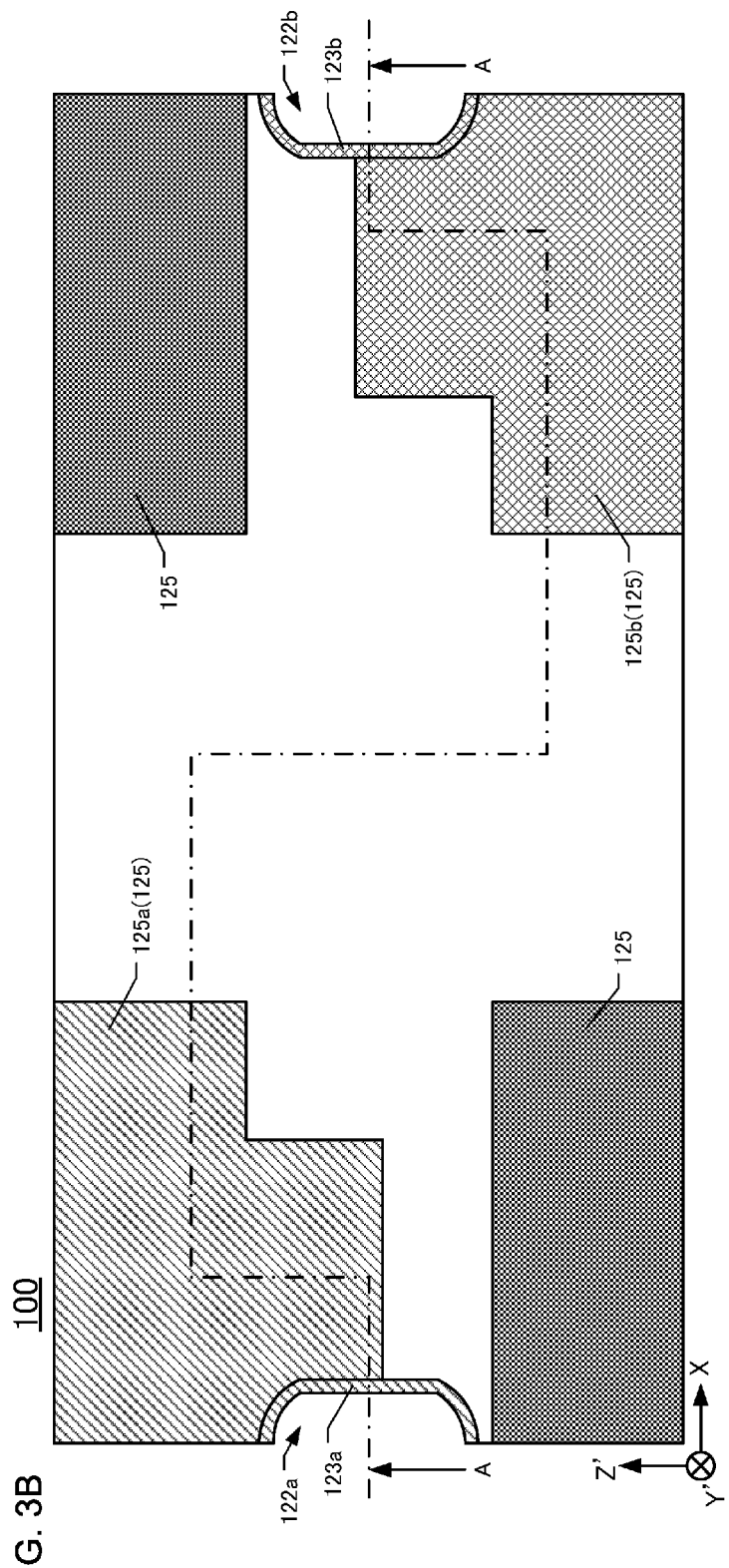
FIG. 3B is a plan view of the lower main surface of the first embodiment of a quartz-crystal vibrating device.

The general configuration of a first embodiment of a quartz-crystal vibrating device 100 is described below with reference to FIGS. 1, 2 and 3A-3B. FIG. 1 is an exploded perspective view of the first embodiment of a quartz-crystal vibrating device 100; FIG. 2 is a perspective view of the first embodiment of a quartz-crystal vibrating piece 100 as used in the first embodiment, after mounting the vibrating piece 10 onto the package base 12 and before bonding the package lid 11 to the package base 12. FIG. 3A is a cross-sectional view of the first embodiment along the line A-A in FIG. 1, and FIG. 3B is a plan view of the lower main surface of the first embodiment of a quartz-crystal vibrating device 100.

In the embodiments described below, an AT-cut quartz-crystal vibrating piece 10 is used as the piezoelectric vibrating piece. An AT-cut quartz-crystal vibrating piece has a principal surface (in the YZ plane) that is tilted by 35° 15' about the Y-axis of the crystal coordinate system (XYZ) in the direction of the Y-axis from the Z-axis around the X-axis. Thus, in the first embodiment, new axes tilted with respect to the axial directions of the quartz-crystal vibrating piece are denoted as the Y'-axis and Z'-axis, respectively. Therefore, in the first embodiment, the longitudinal direction of the quartz-crystal vibrating device 100 is referred as the X-axis direction, the height direction of the vibrating device 100 is referred as the Y'-axis direction, and the direction normal to the X-axis and Y'-axis directions is referred as the Z'-axis direction, respectively.

Turning first to FIG. 1, the first embodiment of a quartz-crystal vibrating device 100 comprises a package lid 11 defining a lid recess 111 configured as a concavity in the inner main surface of the package lid 11, a package base 12, and a quartz-crystal vibrating piece 10 mounted on the package base 12. The quartz-crystal vibrating piece 10 comprises an AT-cut quartz-crystal piece 101. A respective excitation electrode 102a, 102b is situated substantially in the center of the quartz-crystal piece 101 on both main surfaces thereof. Each excitation electrode 102a, 102b is connected to a respective extraction electrode 103a, 103b extending in a respective X-direction on the −Y'-side of the quartz-crystal piece 101.

An exemplary length L6 of the quartz-crystal vibrating piece 10 in the X-axis direction is approximately 2,400 μm. An exemplary width W6 in the Z'-axis direction is approximately 1,500 μm, and exemplary height H6 in the Y'-axis direction is approximately 100 μm. Each excitation electrode and extraction electrode comprises a foundation layer of chromium (Cr) with an overlying layer of gold. An exemplary thickness of the chromium layer is in the range of 0.05 μm to 0.1 μm, and an exemplary thickness of the gold layer is in the range of 0.2 μm to 2 μm.

The package base 12 comprises a first peripheral surface M1 on the upper main surface (+Y'-side surface). The first peripheral surface circumscribes a base recess 121. On both edges of the package base 12 in respective X-axis directions, respective base castellations 122a, 122b are formed. The castellations 122a, 122b are formed simultaneously with formation of the base through-holes BH1 (refer to FIG. 7), and extend in the Z'-axis direction. On the base castellations 122a, 122b are respective base edge-surface electrodes 123a, 123b (refer to FIG. 3A). A connecting electrode 124a, situated on the first peripheral surface M1 and extending in the −X-axis direction on the package base 12, is electrically connected to the respective base edge-surface electrode 123a. Similarly, a connecting electrode 124b, situated on the first peripheral surface M1 and extending in the +X-axis direction on the package base 12, is electrically connected to the respective base edge-surface electrode 123b. The package base 12 also comprises a pair of mounting terminals 125a, 125b, which are electrically connected to respective base edge-surface electrodes 123a, 123b.

As shown in FIG. 2, an exemplary length L1 of the package base 12 in the X-axis direction is approximately 3,200 μm. An exemplary width W1 in the Z'-axis direction is approximately 2,500 μm, and an exemplary height H3 in the Y'-axis direction is approximately 300 μm. The length W2 of the base castellations 122a, and 122b in the Z'-axis direction is approximately ⅓ to ½ of the width W1 of the package base. Consequently, the length W2 is approximately 800 μm to 1,300 μm. The length W3 of the connecting electrodes 124a, 124b in the Z'-axis direction is between the same length to ½ of the length W2 of the base castellations 122a, 122b. Consequently, the length W3 is approximately 700 μm to 1,300 μm.

As shown in FIG. 3A, the length L5 of the base recess 121 in the X-axis direction is approximately 2,210 μm, which is shorter than the length L6 of the quartz-crystal vibrating piece 10 in the X-axis direction. The depth of the base recess 121 is approximately 40 μm. The base edge-surface electrodes and respective connecting electrodes and mounting terminals have the same configurations as the respective excitation electrodes and extraction electrodes.

In view of the foregoing, the length L6 (2,400 μm) of the first embodiment of a quartz-crystal vibrating device 100 is greater than the length L5 (2,210 μm) of the base recess 121. As a result, when mounting the quartz-crystal vibrating piece 10 onto the package base 12 using electrically conductive adhesive 13, both ends of the quartz-crystal vibrating piece 10 in the X-axis direction are mounted onto the first peripheral surface M1 of the package base 12. As shown in FIG. 3A, during bonding, the extraction electrodes 103a, 103b on the quartz-crystal vibrating piece 10 are electrically connected to respective connecting electrodes 124a, 124b on the package base 12. Thus, the mounting terminals 125a, 125b are electrically connected to the respective excitation electrodes 102a, 102b via the respective base edge-surface electrodes 123a, 123b and respective connecting electrodes 124a, 124b, electrically conductive adhesive 13, and extraction electrodes 103a, 103b. Whenever an alternating voltage is applied across the mounting terminals 125a, 125b, the quartz-crystal vibrating device 10 exhibits thickness-shear vibration.

Since the connecting electrodes 124a, 124b on the package base 12 spread in width (dimension W3: over 700 μm), the extraction electrodes 124a, 124b can be more widely connected to the respective connecting electrodes 124a, 124b. This ensures that the extraction electrodes 103a, 103b and connecting electrodes 124a, 124b are electrically connected together reliably and with low line resistance. As also shown in FIG. 2, the vibration frequency of the quartz-crystal vibrating piece 10 can be measured by contacting probes PB1 and PB2 of a frequency-measuring device to the connecting electrodes 124a, 124b. Since the areas of the connecting electrodes 124a, 124b are relatively large, the vibration frequency of the quartz-crystal vibrating piece 10 can be measured easily and precisely.

Turning now to FIG. 3B, a respective mounting terminal 125 is situated on each of the four corners of the lower (mounting) main surface of the package base 12. Of the four terminals, the mounting terminals 125a, 125b are electrically connected to the base edge-surface electrodes 123a, 123b, respectively, and the remaining two mounting terminals are used as electrical-ground terminals.

As shown in FIGS. 1, 2, and 3A-3B, the quartz-crystal vibrating device 100 defines a cavity CT in which the quartz-crystal vibrating piece 10 is situated. The cavity CT is defined in part as a concavity in the inner main surface of the package lid 111 and in part by the base recess 121 of the package base 12. The cavity CT is filled with an inert-gas or is under a vacuum.

The package lid 11 comprises a second peripheral surface M2 on the main surface thereof facing in the −Y'-axis direction. The surface M2 extends around the periphery of the lid recess 111. The second peripheral surface M2 of the package lid 11 is bonded onto the first peripheral surface M1 of the package base 12 using a non-electrically conductive adhesive, for example, a low-melting-point glass LG.

Low-melting-point glass LG is a lead-free vanadium-based glass having an adhesive component that melts at 350° C. to 400° C. Vanadium-based glass can be formulated as a paste mixed with binder and solvent. Vanadium-based glass bonds to various materials by melting and solidification. The melting point of a vanadium-based glass is lower than the melting point of the package lid 11 or the melting point of the package base 12. Low-melting-point glass forms a highly reliable air-tight seal and resists water and humidity. Vanadium-based glass resists incursion of atmospheric water vapor into the cavity CT and thus prevents moisture-caused damage to the airtightness of the cavity CT. Also, since the coefficient of thermal expansion of low-melting-point glass can be controlled effectively by controlling its glass structure, the low-melting-point glass can adjust to various coefficients of thermal expansion.

Although similar to the package base 12, the package lid 11 has an exemplary length L1 in the X-axis direction of approximately 3,200 μm and a width W1 (in the Z'-axis direction) of approximately 2,500 μm. The height H2 in the Y'-axis direction is approximately 450 μm. The length L4 of the lid recess 111 in the X-axis direction is approximately 2,600 μm, which is greater than the length L6 of the quartz-crystal vibrating piece 10 in the X-axis direction. The depth of the lid recess 111 is approximately 250 μm.

In view of the foregoing, the length L4 of the lid recess 111 (2,600 μm) is greater than the length L6 (2,600 μm) of the quartz-crystal vibrating piece 10 and the length L5 (2,210 μm) of the package base 121. Therefore, as shown in FIGS. 1 and 3A, the low-melting-point glass LG bonds the package lid 11 and the package base 12 on the outer portions of the first peripheral surface M1 (having a width of approximately 300 μm) of the package base 12.

Method for Manufacturing the First Embodiment of Quartz-Crystal Vibrating Piece

Figure 4:
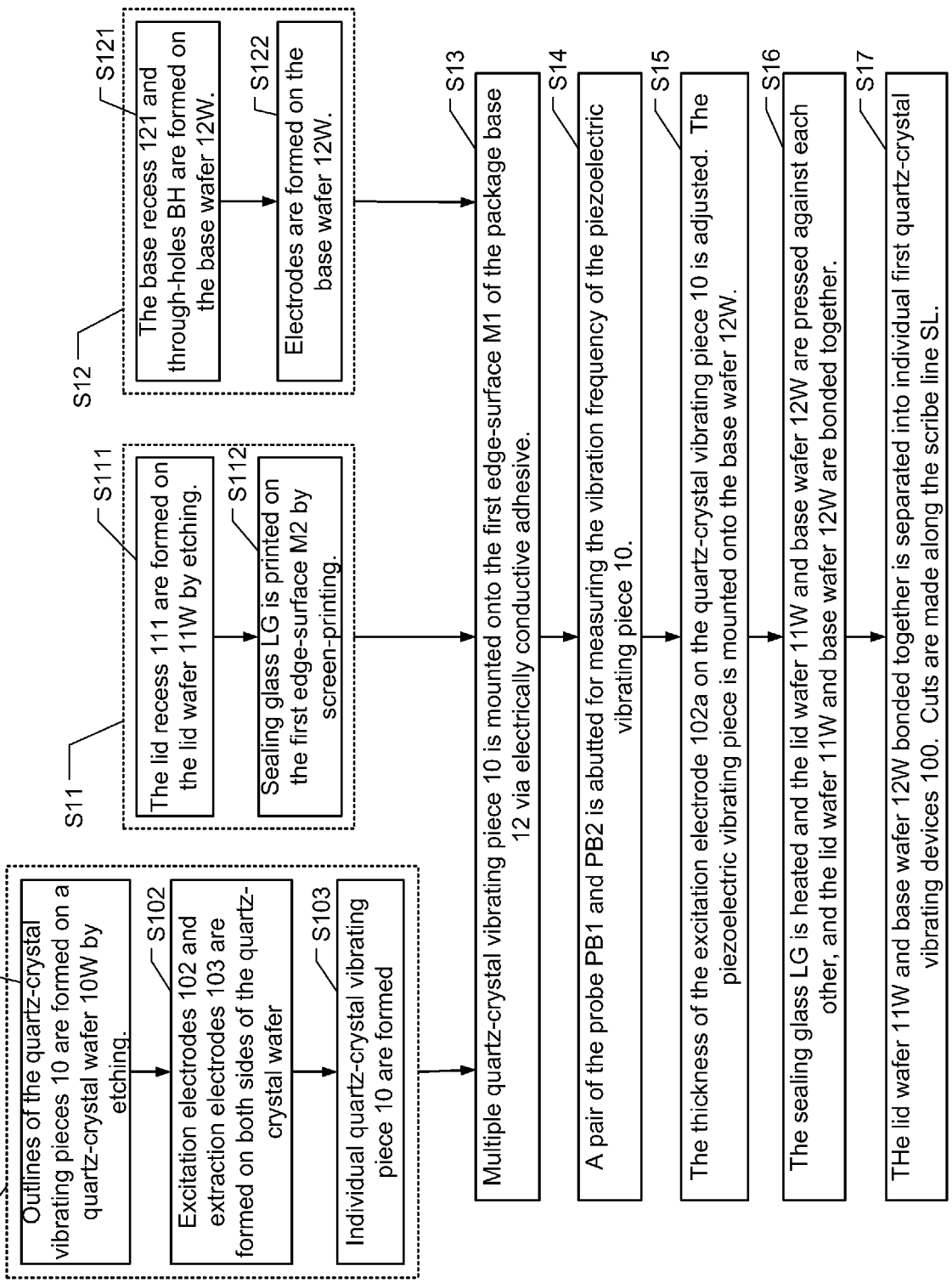
FIG. 4 is a flow-chart of an embodiment of a method for manufacturing a quartz-crystal vibrating device 100 according to the first embodiment.
Figure 5:
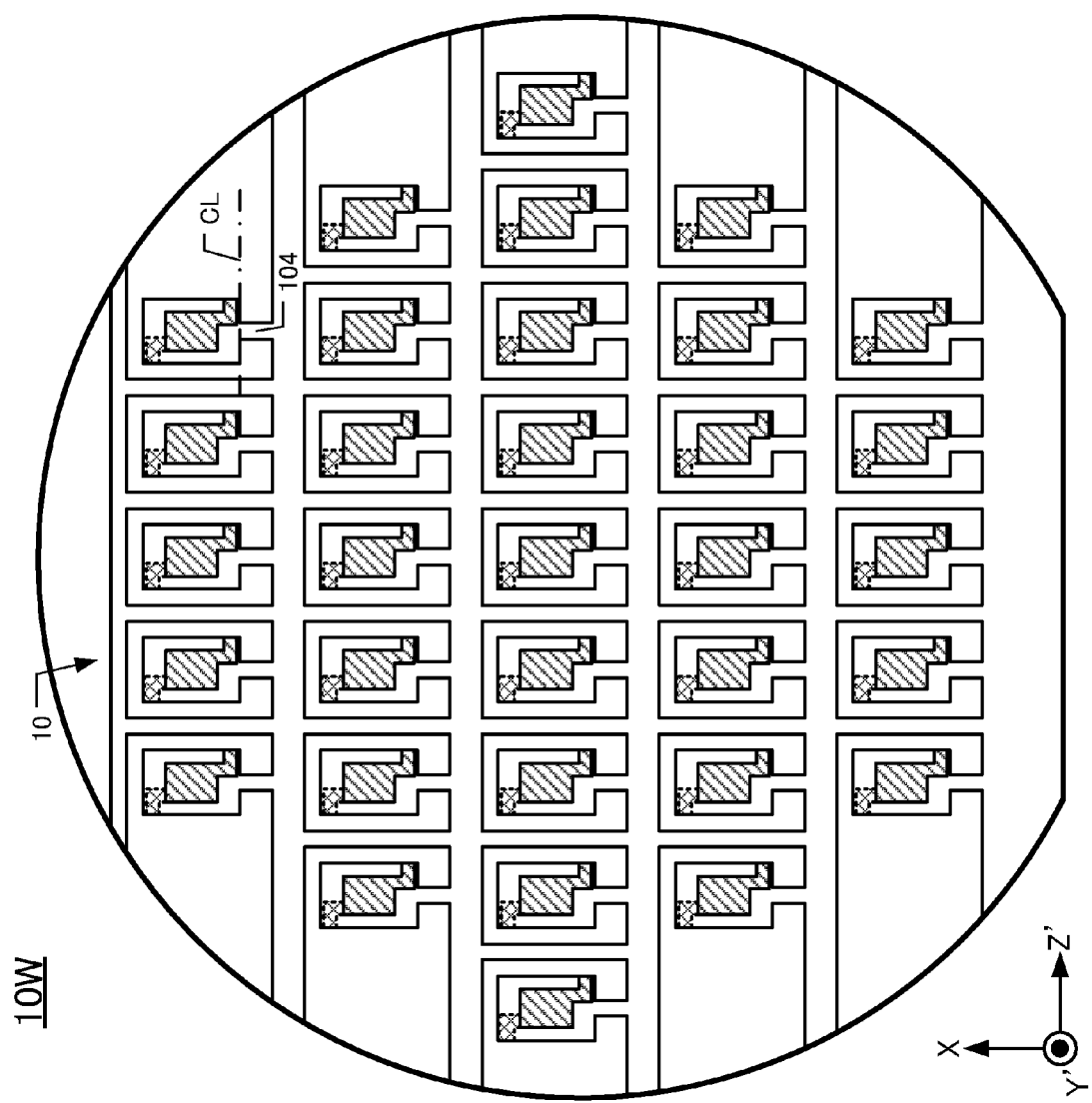
FIG. 5 is a plan view of a quartz-crystal wafer on which multiple quartz-crystal vibrating pieces are manufactured simultaneously.
Figure 6:
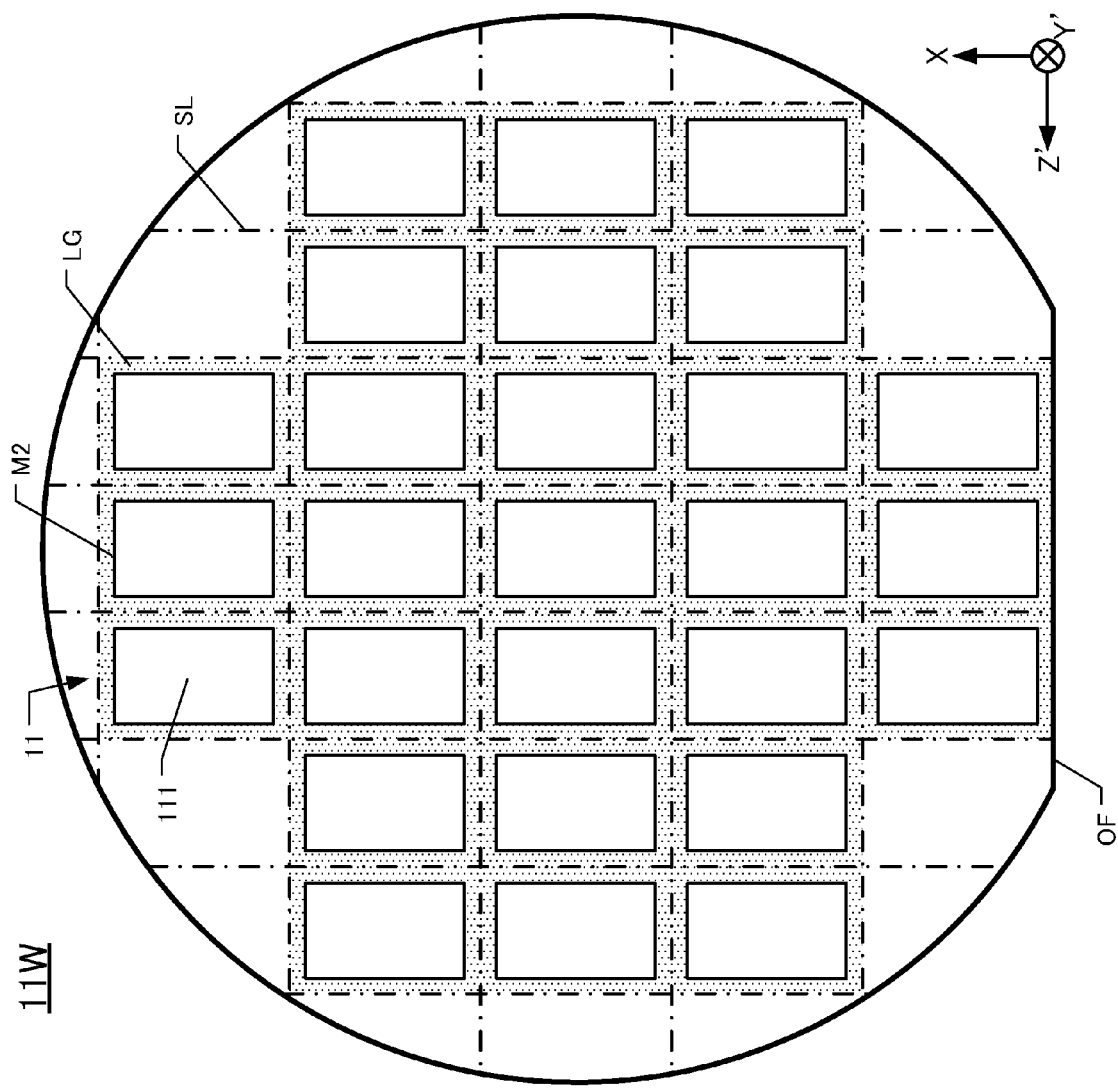
FIG. 6 is a plan view of a lid wafer 11W on which multiple lids are manufactured simultaneously.

FIG. 4 is a flow-chart of an embodiment of a method for manufacturing the first embodiment of a quartz-crystal vibrating device 100. In FIG. 4, the protocol S10 for manufacturing the quartz-crystal vibrating piece 10, the protocol S11 for manufacturing the package lid 11, and the protocol S12 for manufacturing the package base 12 can be carried out separately or in parallel. FIG. 5 is a plan view of the quartz-crystal wafer 10W, FIG. 6 is a plan view of the lid wafer 11W, and IG. 7 is a plan view of the base wafer 12W.

In protocol S10, the quartz-crystal vibrating piece 10 is manufactured. The protocol S10 includes steps S101 to S103. In step S101 (see FIG. 5) the profile outlines of a plurality of quartz-crystal vibrating pieces 10 are formed on a planar quartz-crystal wafer 10W by etching. Each quartz-crystal vibrating piece 10 is connected to the quartz-crystal wafer 10W by a respective joining portion 104.

In step S102 a layer of chromium is formed, followed by formation of an overlying layer of gold, on both main surfaces and side surfaces of the entire quartz-crystal wafer 10W by sputtering or vacuum-deposition. Then, a photoresist is applied uniformly on the surface of the metal layer. Using an exposure tool (not shown), the profile outlines of the excitation electrodes and of the extraction electrodes are lithographically exposed onto the crystal wafer 10W. Next, regions of the metal layer are denuded by etching. As shown in FIG. 5, etching forms the excitation electrodes 102a, 102b and extraction electrodes 103a, 103b on both main surfaces and side surfaces of the quartz-crystal wafer 10W (refer to FIG. 1).

In step S103 the quartz-crystal vibrating pieces 10 on the crystal wafer are cut to separate individual devices. During cutting, cuts are made along cut lines CL (denoted by dot-dash lines in FIG. 5) using a dicing unit such as a laser beam or dicing saw.

In protocol S11, the package lid 11 is manufactured. Protocol S11 includes steps S111 and S112. In step S111 several hundreds to several thousands of lid recesses 111 are formed on a main surface of a lid wafer 11W, the latter being a circular, uniformly planar plate of quartz-crystal material. The lid recesses 111 are formed in the lid wafer 11W by etching or mechanical processing, leaving the first peripheral surfaces M1 around the lid recesses 111.

As shown in FIG. 6, in step S112 low-melting point glass LG is printed on the second peripheral surface M2 of the lid wafer 11W by screen-printing. A film of low-melting-point glass is formed on the second peripheral surface M2 of the lid wafer 11W and preliminarily cured.

Figure 7:
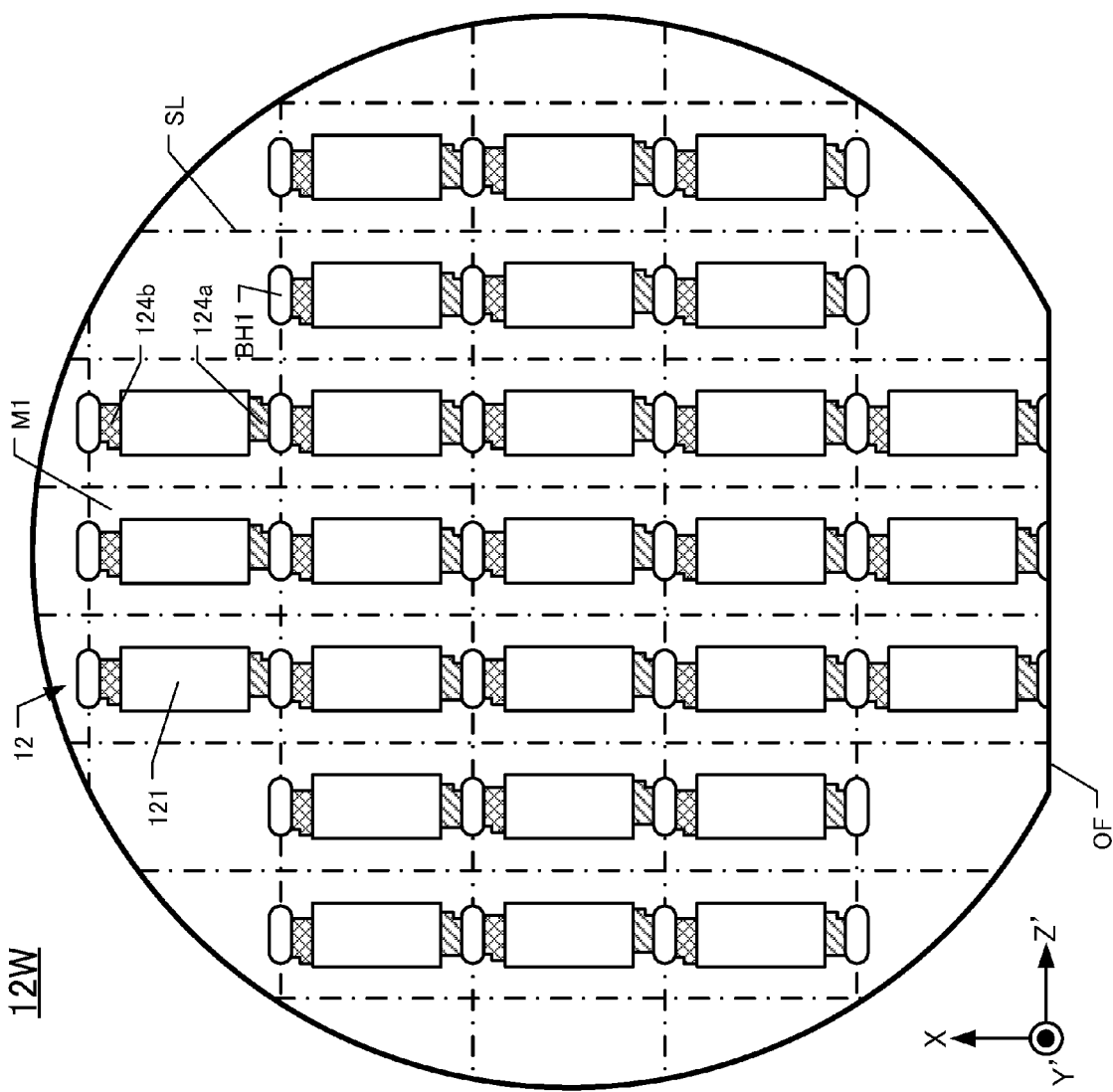
FIG. 7 is a plan view of base wafer 12W on which multiple bases are manufactured simultaneously.

In protocol S12, package bases 12 are manufactured. Protocol S12 includes steps S121 and S122. In step S121, as shown in FIG. 7, several hundreds to several thousands of base recesses 121 are formed on the base wafer 12W, the latter being a circular, uniformly planar plate of quartz-crystal material. On the base wafer 12W, multiple base recesses 121 are formed by etching or mechanical processing. The first peripheral surfaces M1 circumscribe the respective base recesses 121. Also formed are respective rounded-rectangular through-holes BH1 on each edge of the package base 12 in respective X-axis directions. The through-holes extend depthwise through the base wafer 12W. Whenever a base through-hole BH1 is cut in half during dicing, it forms a respective base castellation 122a, 122b (refer to FIG. 1).

In step S122, as shown in FIG. 7, the mounting terminals 125 are formed on the mounting surface (lower or outer main surface of the quartz-crystal vibrating device) at each corner of the package base 12 by sputtering and etching (i.e., the same method as used in step S102). Simultaneously, the base edge-surface electrodes 123a, 123b are formed in the base through-holes BH1, and the connecting electrodes 124a, 124b are formed on the second edge-surface M2.

In step S13, the quartz-crystal vibrating piece 10 (manufactured in protocol S10) is mounted onto the first peripheral surface M1 of the package base 12 using electrically conductive adhesive. The quartz-crystal vibrating piece 10 is mounted onto the first peripheral surface M1 of the package base 12 so as to align the extraction electrodes 103a, 103b formed on the quartz-crystal vibrating piece 10 with respective connecting electrodes 124a, 124b formed on the first peripheral surface M1 of the package base 12. Since the areas for connecting the respective electrodes are relatively large, the extraction electrodes 103a, 103b are electrically connected to their respective connecting electrodes 124a, 124b with high reliability (refer to FIG. 2).

In step S14 probes PB1, PB2 for measuring vibration frequency are contacted to respective connecting electrodes 124a, 124b, and thus the vibration frequency of each quartz-crystal vibrating piece 10 is measured. Thus, the vibration frequency of each quartz-crystal vibrating piece 10 can be measured easily and precisely since the respective areas of the connecting electrodes 124a, 124b are relatively large. In step S14, the probes PB1, PB2 for measuring vibration frequency are touched to respective connecting electrodes 124a, 124b; alternatively, the probes can be touched to the mounting terminals 125a, 125b for measuring vibration frequency.

In step S15 the thickness of the excitation electrode 102a on the quartz-crystal vibrating piece 10 is adjusted. The thickness can be adjusted by sputtering a metal onto the electrode to increase its mass (and to decrease its vibration frequency), or by evaporating some metal from the excitation electrode 102a to decrease its mass (and to increase its vibration frequency). This method for adjusting vibration frequency is discussed in Japan Unexamined Patent Document 2009-141825, in which the assignee is the same as the assignee of the present disclosure. If the measured vibration frequency is within its pre-specified proper range, then adjustment of vibration frequency is not required.

Several hundreds to several thousands of quartz-crystal vibrating pieces 10 are formed simultaneously on a single base wafer 12W. Measurement of the vibration frequency of each quartz-crystal vibrating piece 10 on the wafer (step S14) is followed in step S15 by adjustment (as required) of the vibration frequency of the particular quartz-crystal vibrating piece 10 (step S15). This sequence is repeated for all of the quartz-crystal vibrating pieces 10 on the base wafer 12W. Alternatively, step S14 can be conducted on each quartz-crystal vibrating piece 10 on the base wafer 12W, followed by performing step S15 on each quartz-crystal vibrating piece 10 on the base wafer 12W.

In step S16 the low-melting-point glass LG is heated as the lid wafer 11W and base wafer 12W are compressed against each other. Thus, the lid wafer 11W and base wafer 12W are bonded together by the low-melting-point glass LG.

In step S17 the bonded-together lid wafer 11W and base wafer 12W is cut up to separate individual quartz-crystal vibrating devices 100 from the wafer and from each other. This cutting is performed by cutting along scribe lines SL, denoted by dot-dash lines in FIGS. 6 and 7, using a dicing unit such as a laser beam or a dicing saw. Thus, several hundreds to several thousands of quartz-crystal piezoelectric vibrating devices 100 are produced.

Alternative to First Embodiment of Piezoelectric Vibrating Device

Figure 8A:
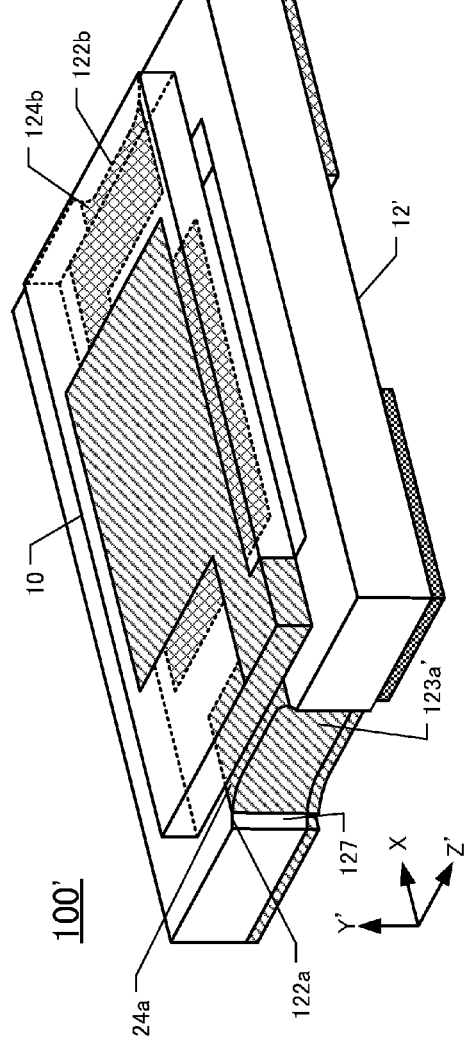
FIG. 8A is a perspective view of the first embodiment of a quartz-crystal vibrating device after mounting the quartz-crystal vibrating piece onto the package base and before bonding together the package lid and the package base.
Figure 8B:
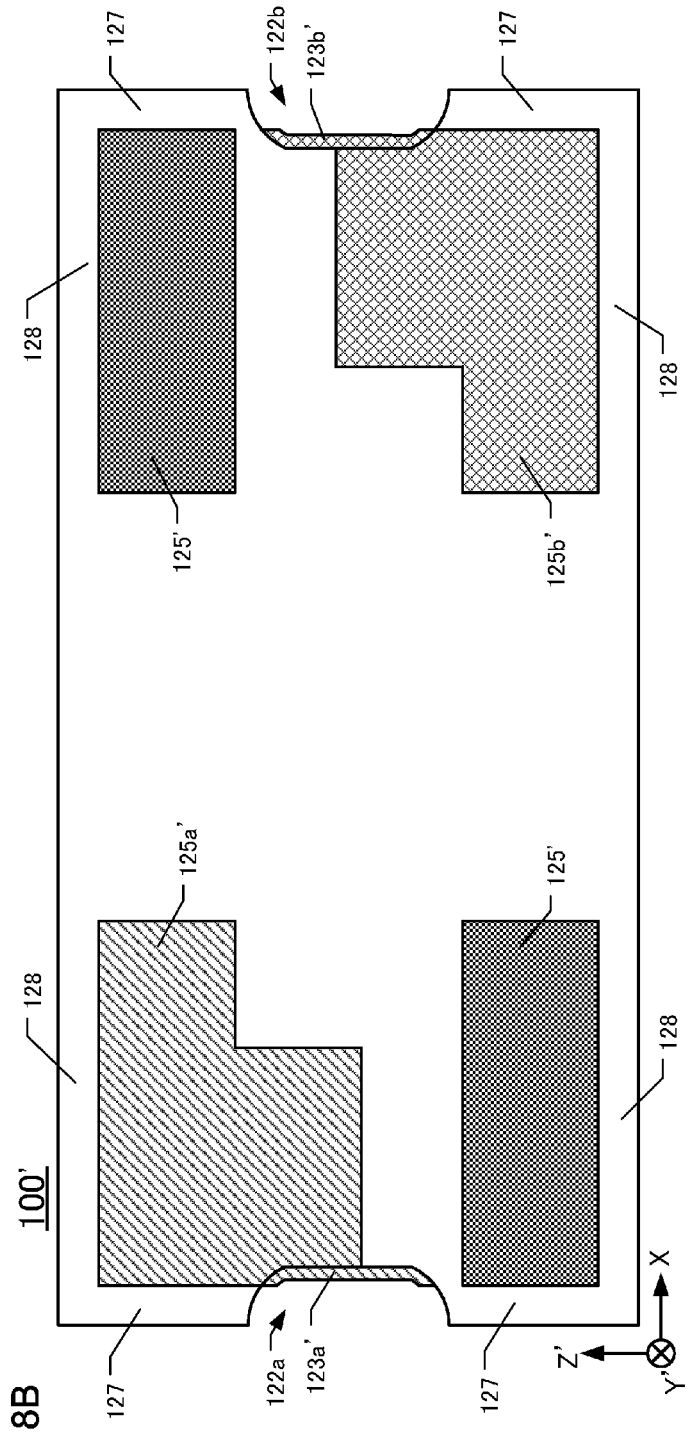
FIG. 8B is a plan view of the lower main surface of the first embodiment of a quartz-crystal vibrating device.
Figure 9:
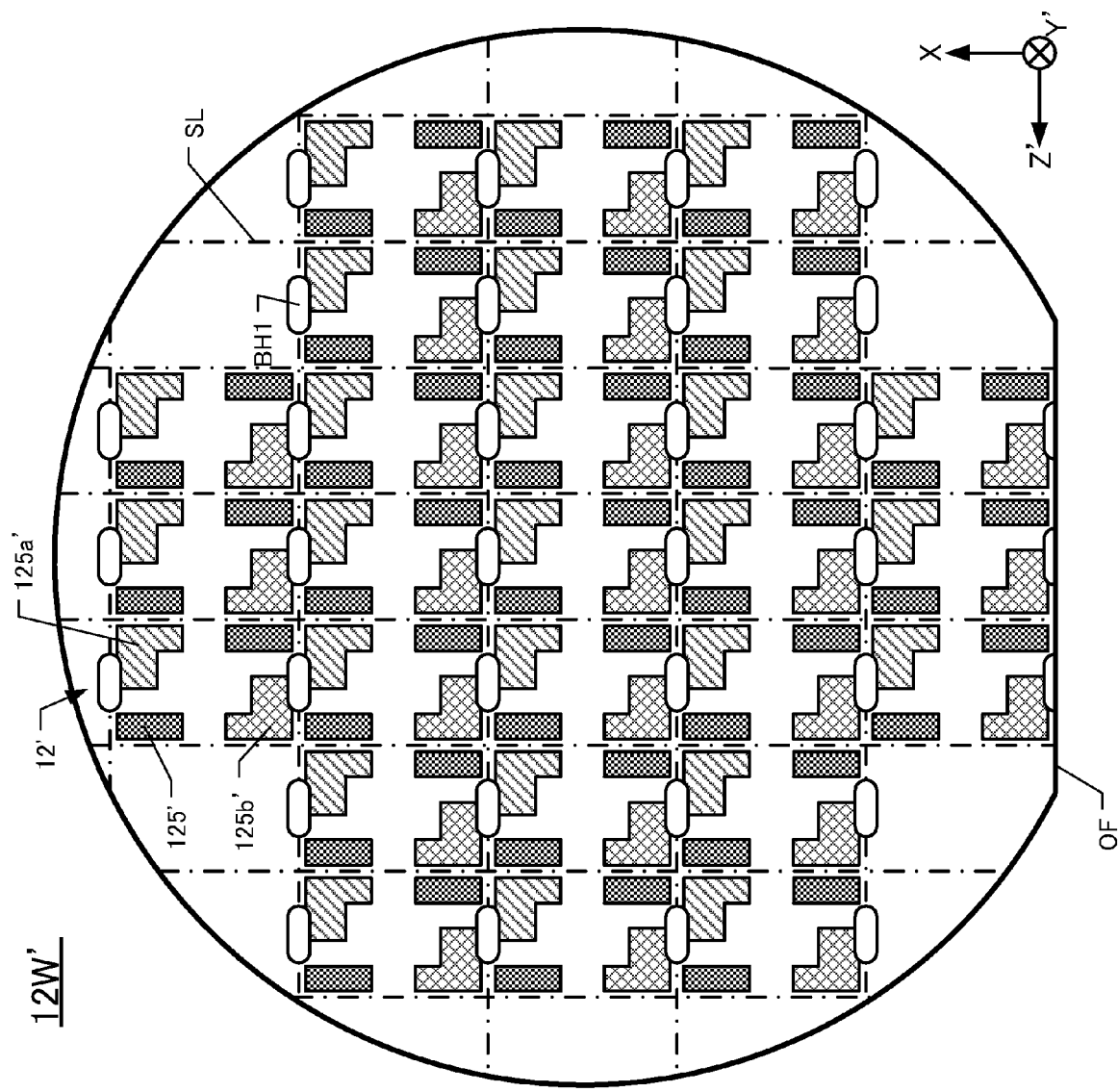
FIG. 9 is a plan view of the undersurface of a base wafer.

This alternative configuration of the first embodiment of a piezoelectric vibrating device 100' is described with references to FIGS. 8A-8B and 9. FIG. 8A is a perspective view of the vibrating device 100' after the quartz-crystal vibrating piece 10 has been mounted onto the package base 12' but before bonding the package lid 11 to the package base 12'. FIG. 8B is a plan view of the lower main surface of the quartz-crystal vibrating device 100', and FIG. 9 is a plan view of the lower main surface of the base wafer 12W' used for producing multiple vibrating devices 100' simultaneously.

As shown in FIG. 8A, the base edge-surface electrodes 123a', 123b' are not formed on the entire surfaces of the respective castellations 122a, 122b on the package base 12'. Rather, these electrodes as formed have substantially the same width as the connecting electrodes 124a, 124b in the Z'-axis direction. Therefore, the mounting terminals 125a', 125b' and 125', shown in FIG. 8B, are disposed to leave spaces 127 near the edges of the package base 12' in the X-axis directions. Similarly, the mounting terminals 125a', 125b', and 125' are disposed so as to form spaces 128 near the edges of the package base 12' in the Z'-axis directions.

According to this configuration, as indicated in FIG. 9, each mounting terminal attached to each package base 12' disposed on the base wafer 12W' is formed apart from all other mounting terminals. This prevents adjacent mounting terminals formed on the package base 12' from electrically contacting each other. Consequently, when the vibration frequencies of the quartz-crystal vibrating pieces 10 on the base wafer are measured using the probes PB1, PB2 (refer to FIG. 2), each quartz-crystal vibrating piece is not affected by other quartz-crystal vibrating pieces mounted on adjacent package bases 12'. This allows the respective vibration frequencies of the quartz-crystal vibrating pieces to be measured more precisely.

Second Embodiment of Quartz-Crystal Vibrating Device

The overall configuration of the second embodiment of a quartz-crystal vibrating device 200 is explained with reference to FIGS. 10, 11, and 12A-12B. The second embodiment of a quartz-crystal vibrating device 200 comprises a tuning-fork type quartz-crystal vibrating piece 20. Consequently, its coordinates do not correspond to the coordinates for the AT-cut coordinates used in the first embodiment. Therefore, in FIGS. 10, 11, 12A-12B, 13, and 14, the same X-axis direction is used, but the extension direction of the vibrating arms 205 is referred as the Y-axis direction and the direction normal to both the X-axis direction and Y-axis direction is referred to as the Z-axis direction.

Figure 10:
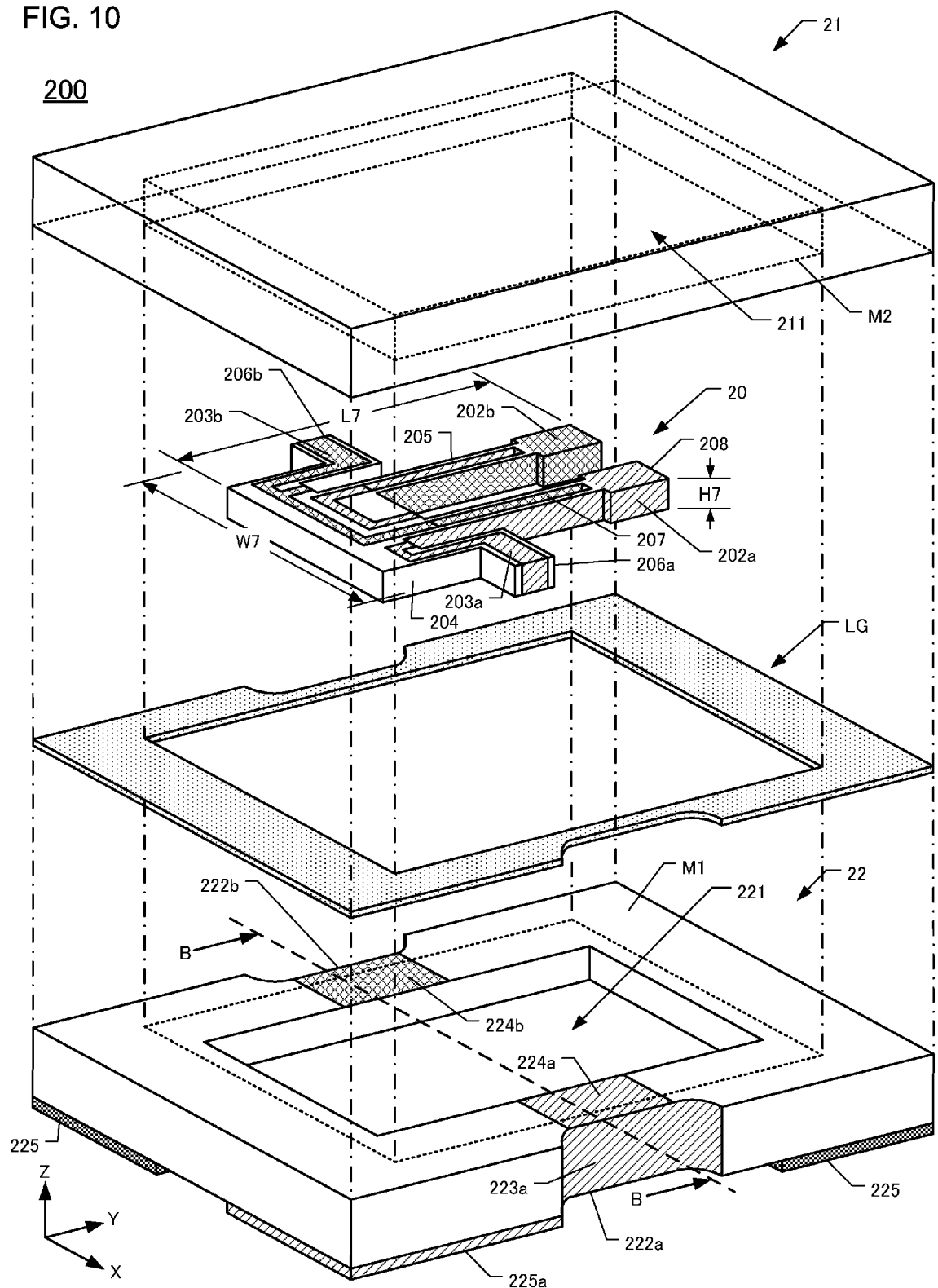
FIG. 10 is an exploded perspective view of the second embodiment of a quartz-crystal vibrating device.

Turning to FIG. 10, the second embodiment of a quartz-crystal vibrating device 200 comprises a package lid 21, a lid recess 211 defined by a concavity of the inner main surface of the package lid 21, a package base 22, a base recess 221 defined by a concavity of the inner main surface of the package base 22, and a tuning-fork type quartz-crystal vibrating piece 20. The vibrating piece 20 comprises a pair of vibrating arms 205, which are mounted on the package base 22.

The tuning-fork type quartz-crystal vibrating piece 20 comprises a base 204 formed on the −Y-axis side of the vibrating arms 205. The base 204 has a nearly rectangular-shape as viewed from the Z-axis direction. The vibrating arms 205 extend from one side of the base 204 in the +Y-axis direction. The cross-section of a vibrating arm 205 is nearly rectangular in shape. On each vibrating arm, a respective excitation electrode 202a, 202b is formed on each upper surface, each lower surface, and on both side surfaces. A respective groove 207, extending in the Y-axis direction, can be formed on each upper surface and each lower surface of each vibrating arm 205. Whenever the excitation electrodes extend into the respective grooves 207, the electrical field generated on the vibrating arms 205 is enhanced, which reduces the crystal impedance (CI). Each vibrating arm 205 also can include a weight 208 on the distal end of the vibrating arms 205 (in the +Y-axis direction). The weights 208 are formed so that the vibrating arms 205 on the tuning-fork type quartz-crystal vibrating piece 20 can vibrate easier. The weights 208 also facilitate adjustment of vibration frequency of the arms. The tuning-fork type quartz-crystal vibrating piece 20 is distinctly small, and exhibits a vibration frequency of, for example, 32.768 kHz.

The tuning-fork type quartz-crystal vibrating piece 20 comprises a respective supporting arm 206a, 206b associated with each vibrating arm 205a, 205b. Each supporting arm extends from the base 204 outward in the X-axis direction and then in the Y-axis direction to about mid-length of the vibrating piece 20. The distal tip of each supporting arm extends further in the X-axis directions. The supporting arms 206a, 206b prevent vibrations produced by the vibrating arms 205 from propagating outside the quartz-crystal vibrating device 200. The supporting arms 206a, 206b also enhance the resistance of the vibrating piece to physical and thermal shocks while being mounted inside the cavity CT. The base 204, vibrating arms 205, and supporting arms 206a, 206b are formed at the same thickness and are formed simultaneously by wet-etching.

On the tuning-fork type quartz-crystal vibrating piece 20, respective extraction electrodes 203a, 203b are formed on each side and extending from the respective vibrating arms 205 to the distal ends of the respective supporting arms 206a, 206b. The extraction electrodes 203a, 203b are connected to the respective excitation electrodes 202a, 202b on the vibrating arms 205.

An exemplary length L7 of the tuning-fork type quartz-crystal vibrating piece 20 in the Y-axis direction is 2,000 μm; an exemplary width W7 is 1,800 μm, and an exemplary height H7 is 100 μm. The length L7 refers to the distance between the distal end of the respective vibrating arm 205 (in the +Y-axis direction) and the distal end of the base 204 (in the −Y-axis direction). The width W7 refers to the distance between the distal end of the respective supporting arm 206a, 206b (in the +X-axis direction) and the distal end of the respective supporting arm (in the −X-axis direction).

The package base 22 comprises a first peripheral surface M1 extending around the periphery of the upper main surface (main surface in the +Z-axis direction) of the base recess 221. On the package base 22, respective base castellations 222a, 222b are formed on each X-axis direction side. The castellations are formed simultaneously with forming the base through-holes BH2 (refer to FIG. 14) and extend in the Y-axis directions. On the base castellations 222a, 222b are respective base edge-surface electrodes 223a, 223b (refer to FIG. 12A). Also, on the first peripheral surface M1 of the package base 22 in the +X-axis direction, a respective connecting electrode 224a is formed for providing electrical connection to the base edge-surface electrode 223a. Similarly, on the first peripheral surface M1 of the package base 22 in the −X-axis direction, respective connecting electrodes 224a, 224b are formed for providing electrical connection to the respective base edge-surface electrodes 223a, 223b. Furthermore, on the mounting surface of the quartz-crystal vibrating device (i.e., lower main surface of the package base 22), a pair of mounting terminals 225a, 225b are provided for forming electrical connections to respective base edge-surface electrodes 223a, 223b (refer to FIG. 12B).

Figure 11:
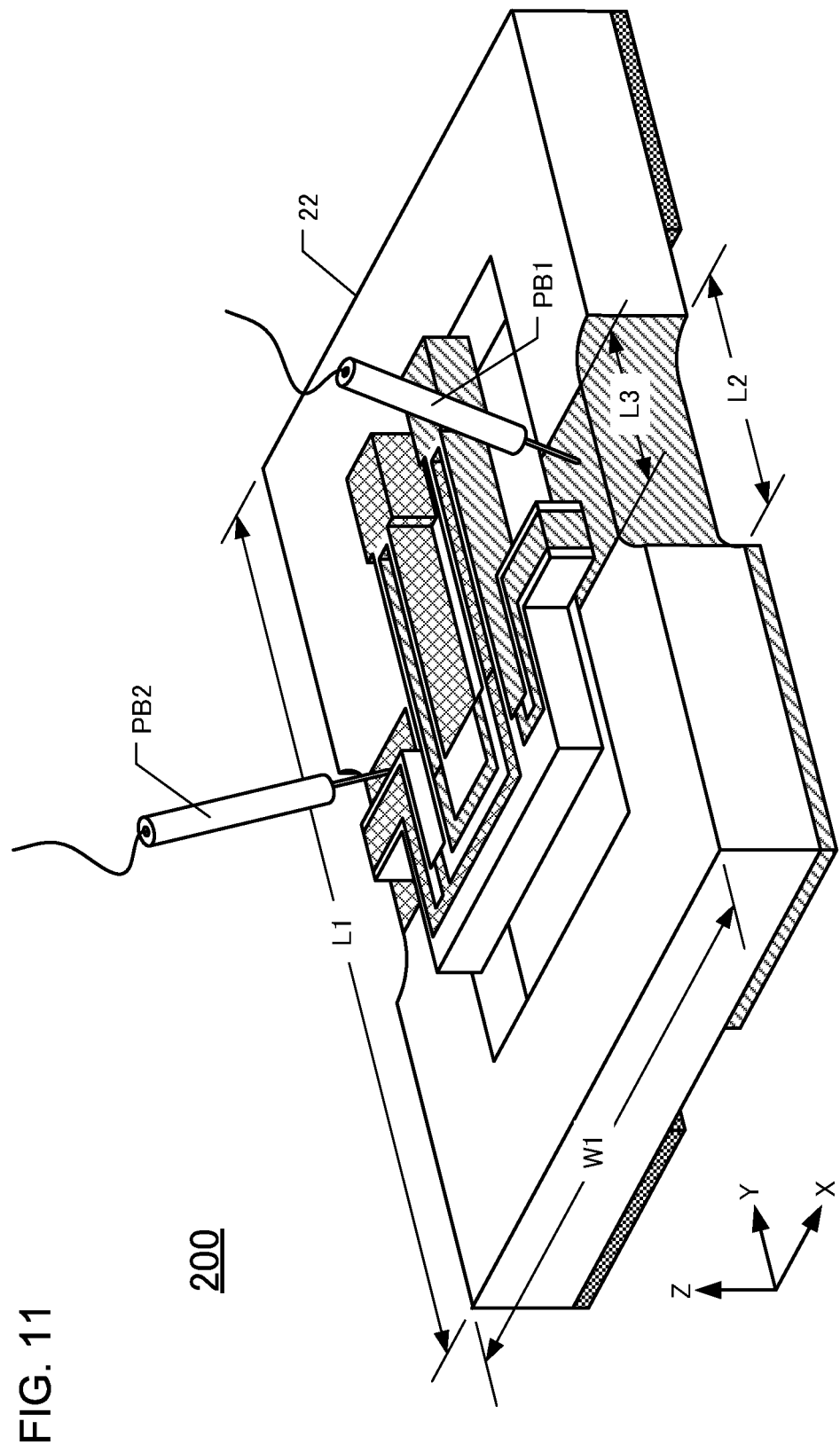
FIG. 11 is a perspective view of the second embodiment of a quartz-crystal vibrating device after mounting a quartz-crystal vibrating device onto the package base but before bonding together the package lid and package base.

Turning to FIG. 11, the outer dimension of the package base 22 is as same as of the package base 12 of the first embodiment. The length L2 of the base castellations 222a, 222b in the Y-axis direction is approximately in the range of ⅓ to ½ the length L1 of the package base 22, which corresponds to 1,000 to 1,600 μm. The length L3 of the connecting electrodes 224a, 224b in the Y-axis direction is approximately in the range of equal to the length L2 to half the length L2 of the base castellations 222a, 222b, which corresponds to 800 to 1,600 μm.

Figure 12A:
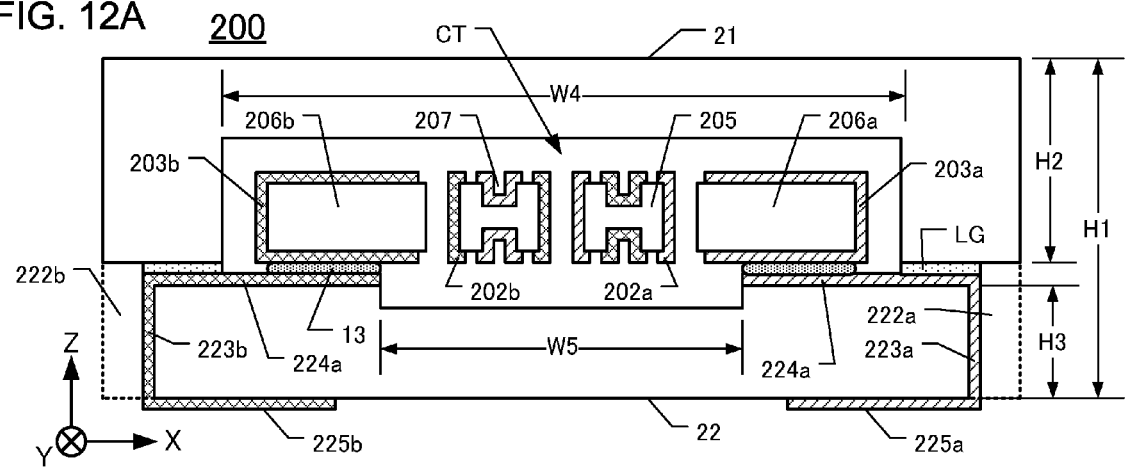
FIG. 12A is a cross-sectional view of the second embodiment along the line B-B in FIG. 10.

In FIG. 12A, the width W5 of the base recess 221 in the X-axis direction is approximately 1,500 μm, which is shorter than the width W7 (approximately 1,800 μm) of the tuning-fork type quartz-crystal vibrating piece 20 in the X-axis directions. The depth of the base recess 121 is approximately 40 μm. The base edge-surface electrodes, connecting electrodes, and mounting terminals all have the same configurations as the excitation electrodes and extraction electrodes.

Thus, as shown in FIG. 12A, in this second embodiment of a quartz-crystal vibrating device 200, the width W7 (1,800 μm) of the vibrating piece 20 is greater than the width W5 of the base recess 221. Therefore, whenever the tuning-fork type quartz-crystal vibrating piece 20 is mounted onto the package base 22 using electrically conductive adhesive 13, the edges of the supporting arms 206a, 206b on the vibrating piece 20 are mounted onto the first peripheral surface M1 of the package base 22. The extraction electrodes 203a, 203b are electrically connected to respective connecting electrodes 224a, 224b. Thus, the mounting terminals 225a, 225b are electrically connected to respective excitation electrodes 202a, 202b via respective base edge-surface electrodes 223a, 223b, connecting electrodes 224a, 224b, electrically conductive adhesive 13, and respective extraction electrodes 203a, 203b. Whenever an alternating voltage is applied across the mounting terminals 225a, 225b, the vibrating arms 205 of the tuning-fork type quartz-crystal vibrating piece 20 vibrate.

Since the connecting electrodes 224a, 224b on the package base 22 are formed wider (L3; 800 μm), the extraction electrodes 203a, 203b can be connected reliably to the respective connecting electrodes 224a, 224b whenever the vibrating piece 20 is bonded to the package base 22. This ensures that the extraction electrodes 203a, 203b are electrically connected to the respective connecting electrodes 224a, 224b with high reliability.

In FIG. 11 the vibration frequency of the tuning-fork type quartz-crystal vibrating piece 20 can be measured by contacting respective vibration-measurement probes PB1, PB2 to respective connecting electrodes 224a, 224b. Since the area of the connecting electrodes 224a, 224b is relatively large, the vibration frequency of the vibrating piece 20 can be measured easily and precisely.

Figure 12B:
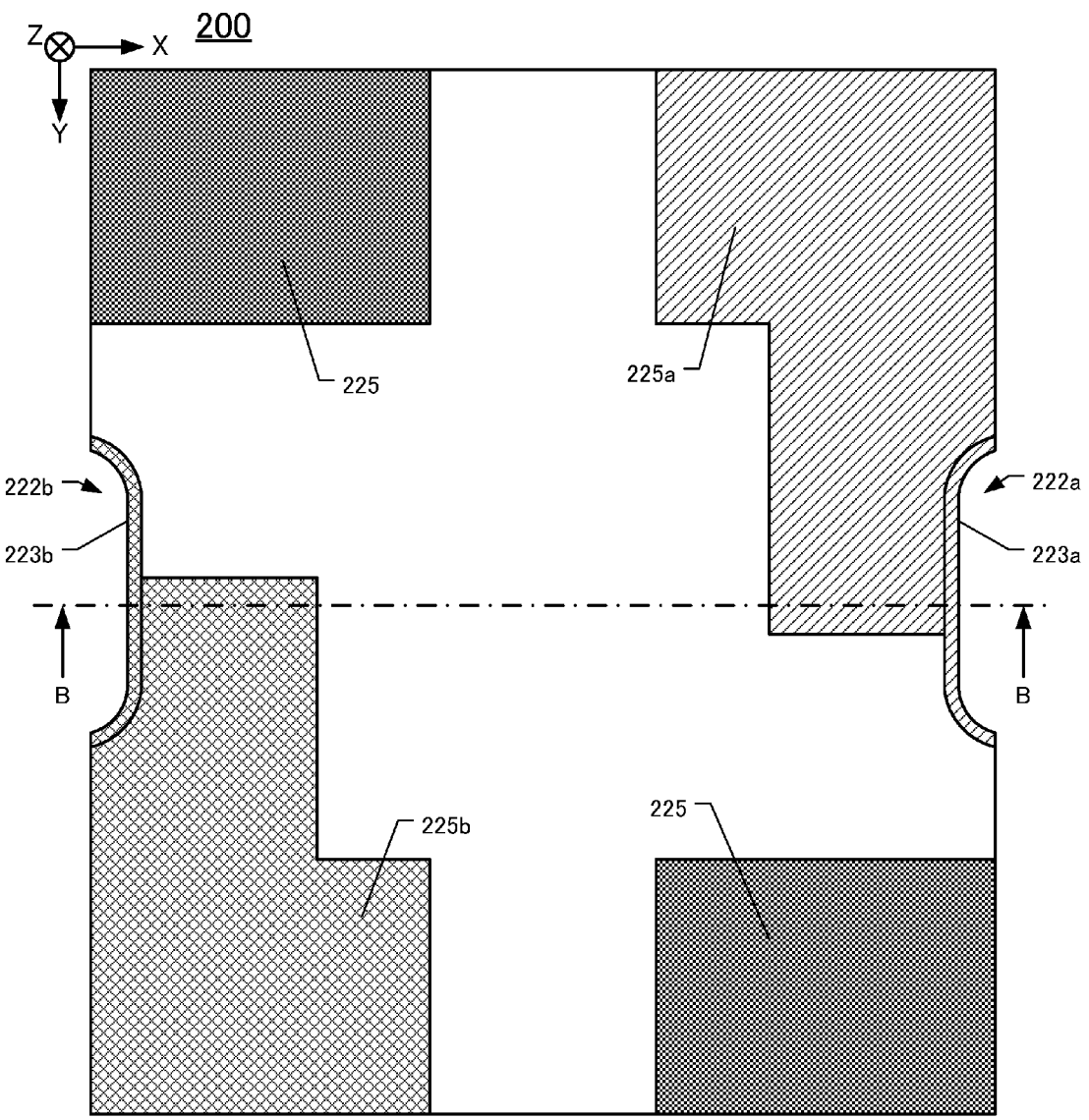
FIG. 12B is a plan view of the lower main surface of the second embodiment of a quartz-crystal vibrating device.

In FIG. 12B four mounting terminals 225 are formed on the mounting surface of the package base 22. Among these four terminals, two mounting terminals 225a, 225b are electrically connected to respective base edge-surface electrodes 223a, 223b. The remaining two mounting terminals are used as electrical-ground terminals.

As shown in FIGS. 10-12, each quartz-crystal vibrating device 200 of this second embodiment comprises a package lid 21 defining a cavity CT. The cavity CT is filled with nitrogen gas or sealed in an airtight manner.

The package lid 21 also defines a second peripheral surface M2 extending around the periphery of the lid recess 211 in the −Z-axis direction. The second peripheral surface M2 of the package lid 21 is bonded to the first peripheral surface M1 of the package base 22 using non-electrically conductive adhesive; e.g., a low-melting-point glass LG.

The outer dimension of the package lid 21 is as same as of the package lid 11 of the first embodiment. The width W4 of the lid recess 211 in the X-axis direction is approximately 2,000 μm, which is longer length than the width W7 (approximately 1,800 μm) of the vibrating piece 20 in the X-axis direction. The depth of the lid recess 211 is approximately 250 μm. Consequently, the width W4 (2,000 μm) of the lid recess 211 is greater than the width W7 (1,800 μm) of the vibrating piece 20 and the width W5 (1,500 μm) of the base recess 221. As shown in FIGS. 10, 11 and 12A-12B, the low-melting-point glass LG bonds the package lid 21 and the package base 22 around the outer periphery (first peripheral surface M1 of the package base 22 (wherein the first peripheral surface has a width of approximately 250 μm).

In the second embodiment, the base edge-surface electrodes are not formed on the entire surface of the respective castellations. Rather, these electrodes can be formed with substantially the same width as of the connecting electrodes (in the Y-axis directions), which is similar to the alternative to the first embodiment.

Figure 13:
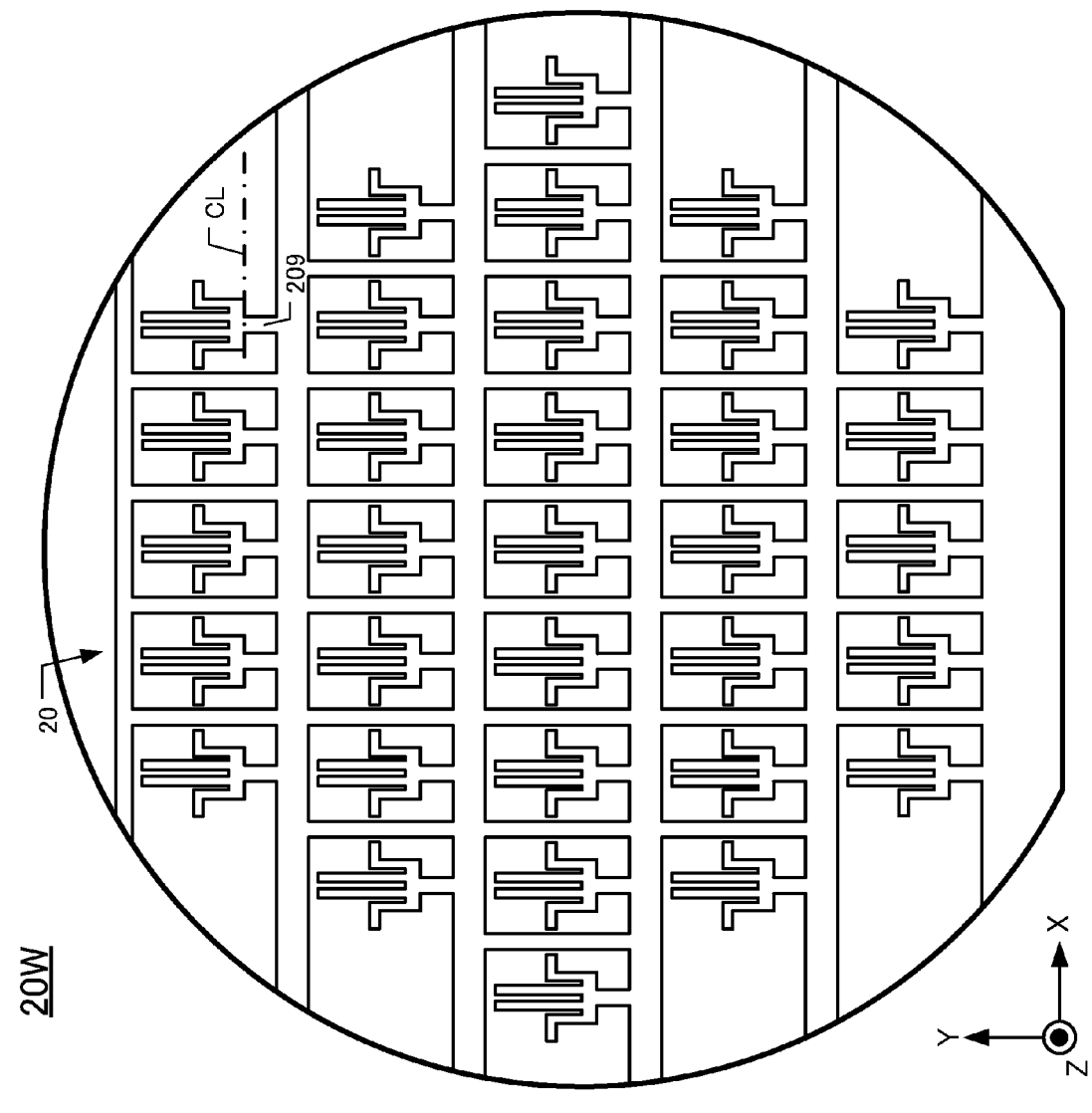
FIG. 13 is a plan view of a quartz-crystal wafer 20W on which multiple vibrating pieces can be manufactured simultaneously.

Method for Manufacturing the Second Embodiment of Quartz-Crystal Vibrating Device This method embodiment can be described with reference to FIG. 4. Also, FIG. 13 is a plan view of the quartz-crystal wafer 20W used in the method, and FIG. 14 is a plan view of the base wafer 22W.

In protocol S10, the tuning-fork type quartz-crystal vibrating piece 20 is manufactured. As shown in FIG. 13, the profile outlines of a plurality of quartz-crystal vibrating pieces 20 are formed on a planar quartz-crystal wafer 10W by etching. Each vibrating piece 20 is connected to the quartz-crystal wafer 20W by a respective joining portion 209. As described previously with respect to step S102 in FIG. 4, excitation electrodes 202a, 202b, and extraction electrodes 203a, 203b are formed. Using a dicing unit such as a laser beam or dicing saw, the bonded quartz-crystal vibrating pieces 20 are cut along cut lines CL (denoted by dot-dash lines in FIG. 13) to separate individual devices from each other.

In protocol S11, the package lid 21 is manufactured. The package lid 21 in the second embodiment has the same shape as the package lid 11 in the first embodiment, but has different dimensions. Nevertheless, the package lid can be manufactured by following the same manufacturing method as used in the first embodiment.

In protocol S12, the package base 22 is manufactured. As shown in FIG. 14, several hundreds to several thousands of base recesses 221 are formed on the base wafer 22W, the latter being a circular, uniformly planar plate of quartz-crystal material. Respective rounded-rectangular through-holes BH2 are formed on each side of the package base 22 in the X-axis directions, so as to extend depthwise through the base wafer 22W. When each base through-hole BH2 is cut in half, it forms a respective base castellation 222a, 222b (refer to FIG. 10). Then, as explained in step S102 in FIG. 4, the base edge-surface electrodes 223a, 223b are formed on the surfaces of the base through-holes BH2. The connecting electrodes 224a, 224b are formed on the second peripheral surface M2.

In step S13, the tuning-fork type quartz-crystal vibrating piece 20 (manufactured in step S10) is mounted onto the first peripheral surface M1 of the package base 22 using electrically conductive adhesive 13.

In step S14, respective frequency-measurement probes PB1, PB2 are contacted to the connecting electrodes 224a, 224b to measure the vibration frequency produced by the quartz-crystal vibrating piece 20.

In step S15, the vibration frequency is adjusted either by irradiating a laser beam on the weights 208 on the vibrating arms 205 to remove mass from the weights. The vibration frequency of each vibrating piece 20 can be adjusted after measuring the vibration frequencies produced by all the vibrating pieces 20 on the base wafer 22W. Alternatively, the vibration frequencies can be measured and adjusted one by one.

In step S16 low-melting-point glass LG is heated while compressing the lid wafer (FIG. 6) and base wafer 22W together. Thus, the lid wafer and base wafer 22W are bonded together by the low-melting-point glass LG.

In step S17, the bonded-together lid wafer (FIG. 6) and base wafer 22W are cut to separate the several hundreds to several thousands of quartz-crystal piezoelectric vibrating devices 200 from each other.

INDUSTRIAL APPLICABILITY

Representative embodiments are described in detail above; however, as will be evident to those skilled in the relevant art, the present invention may be changed or modified in various ways within its technical scope.

In the first and second embodiments, although the package lid and package base are bonded together using low-melting-point glass LG, which is a non-electrically conductive adhesive, the low-melting-point glass can be replaced by a polyimide resin. Whenever polyimide resin is used, the manufacturing process can be replaced with screen-printing, or an exposure step can be performed after applying photolithographic polyimide resin on the entire surface.

Although mounting terminals are formed on the four corners of the lower main bottom surface of the package base, they can be replaced with a pair of mounting terminals formed on both sides of the package in the X-axis directions. When forming mounting terminals in this manner, the grounding terminal(s) is not formed.

Although a quartz-crystal vibrating piece was used in the embodiments described above, other embodiments can be made with equal facility that comprise piezoelectric materials such as lithium tantalite and/or lithium niobate. Further, the present disclosure may be directed to piezoelectric oscillators in which an IC accommodating an oscillating circuit is mounted inside the package on the package base.

Furthermore, even though a plurality of quartz-crystal vibrating pieces are described as being formed on wafers simultaneously, the polishing, etching, and forming of electrodes can be done on individual quartz-crystal pieces.

What is claimed is:

1. A piezoelectric device, comprising:
a package base having a rectangular profile, the package base including an outer main surface including a pair of external electrodes and an inner main surface situated opposite the outer main surface, the inner main surface defining a first recess and a first bonding surface peripherally surrounding the first recess, and including respective connecting electrodes electrically connected to the external electrodes;
a piezoelectric vibrating piece mounted to the inner main surface of the package base and including respective excitation electrodes electrically connected to the connecting electrodes;
a package lid defining a second recess and a second bonding surface, the second bonding surface having a width and peripherally surrounding the second recess, the second recess being larger than the first recess, and the lid covering the piezoelectric vibrating piece mounted to the package base; and
a sealing material, having a width substantial equal to the width of the second bonding surface, disposed circumferentially between the first bonding surface and the second bonding surface, thereby sealing the package lid to the package base,
wherein the package base has a rectangular plan profile, when viewed from above, that includes first and second opposing edges, each edge having a length and defining a respective castellation in a center of the respective edge, each respective castellation having a length that is $\frac{1}{3}$ to $\frac{1}{2}$ the length of the respective edge,
each connecting electrode is situated in a respective one of said castellations, wherein each connecting electrode has a length that is greater than $\frac{1}{2}$ the length of the respective castellation, and each connecting electrode has a length that is greater than $\frac{1}{4}$ the length of the respective edge.

* * * * *